(12) United States Patent
Xing et al.

(10) Patent No.: US 8,866,545 B2
(45) Date of Patent: Oct. 21, 2014

(54) LINEARITY POWER AMPLIFICATION DEVICE

(71) Applicant: GE Medical Systems Global Technology Company, LLC, Waukesha, WI (US)

(72) Inventors: Haoyang Xing, Beijing (CN); Yu Liu, Beijing (CN); Anmou Liao, Beijing (CN); Chenxing Zhao, Beijing (CN); Kai Wang, Beijing (CN)

(73) Assignee: GE Medical Systems Global Technology Company, Waukesha, WI (US)

( * ) Notice: Subject to any disclaimer, the term of this patent is extended or adjusted under 35 U.S.C. 154(b) by 1 day.

(21) Appl. No.: 13/628,637

(22) Filed: Sep. 27, 2012

(65) Prior Publication Data

US 2013/0082774 A1    Apr. 4, 2013

(51) Int. Cl.
| | |
|---|---|
| *H03F 3/68* | (2006.01) |
| *H03F 1/32* | (2006.01) |
| *H03F 3/20* | (2006.01) |
| *H03F 3/21* | (2006.01) |
| *H03F 1/26* | (2006.01) |

(52) U.S. Cl.
CPC ........ *H03F 1/26* (2013.01); *H03F 2203/21106* (2013.01); *H03F 2203/21142* (2013.01); *H03F 1/3229* (2013.01); *H03F 3/20* (2013.01); *H03F 3/211* (2013.01); *H03F 1/3282* (2013.01); *H03F 1/3247* (2013.01)
USPC .......................................... 330/124 R; 330/84

(58) Field of Classification Search
CPC ...................................... H03F 1/26; H03F 3/68
USPC ................................ 330/84, 124 R, 151, 295
See application file for complete search history.

(56) References Cited

U.S. PATENT DOCUMENTS

| | | | |
|---|---|---|---|
| 6,104,241 A | 8/2000 | Cova et al. | |
| 6,714,072 B2 * | 3/2004 | Kenington | 330/149 |

\* cited by examiner

*Primary Examiner* — Steven J Mottola
(74) *Attorney, Agent, or Firm* — GE Global Patent Operation; Mark A. Conklin

(57) ABSTRACT

A linearity power amplification device is provided. The device comprises a divider, a combiner, n−1 first signal paths, and a second signal path coupled between the divider and the combiner. The first signal path comprises a main invariable attenuator connected to the divider, a first power amplifier connected to the combiner, and a first attenuator and a first shifter coupled between the first power amplifier and the main invariable attenuator. The second signal path comprises a main amplification circuit, and an error calibration circuit.

11 Claims, 4 Drawing Sheets

US 8,866,545 B2

LINEARITY POWER AMPLIFICATION DEVICE

CROSS-REFERENCE TO RELATED APPLICATIONS

This application claims foreign priority benefits under 35 U.S.C. §119 to co-pending Chinese Patent Application No. 201110316909.4, filed Sep. 30, 2011, which is hereby incorporated by reference in its entirety as part of the present disclosure.

BACKGROUND OF THE INVENTION

Embodiments of the present invention relate to a linearity power amplification device and, more specifically, to a linearity power amplification device using a feedforward-predistortion system to eliminate error signals.

High Linearity power amplifiers are very important in MR systems. Its power is generally more than 16 KW. High power amplifiers work near the saturation region having non-linearity characteristics to produce the maximum output. However, in the case of the high power amplifier with multi-carrier inputs, generally distortions would be caused. Therefore, the amplifier's quality is deteriorated.

U.S. Pat. No. 6,104,241 discloses a linearity power amplifier arrangement. The linearity power amplifier arrangement comprises: an RF input port to which an RF input signal is applied, an RF output port from which an RF output signal is derived, first and second RF signal processing paths coupled between the input and output ports and containing first and second RF power amplifiers, and an output signal combiner.

The first RF signal processing path includes a first RF signal vector modulator, that is controllably operative to adjust one or more parameters of a first RF input signal component applied to the first RF power amplifier.

The second RF signal processing path includes a predistortion unit and an intermodulation distortion (IMD) extraction circuit. The predistortion unit contains a second RF signal vector modulator and a predistorter, that is controllably operative to predistort a second RF input signal component applied to the second RF power amplifier in a manner that compensates for the presence of distortion energy applied to the second RF power amplifier that is not applied to the first RF power amplifier. The IMD extraction circuit is coupled to the RF input port and to an output of the first RF power amplifier and is operative to generate the second RF input signal component as a combination of the RF input signal and an IMD component.

The output signal combiner is coupled to outputs of the first and second RF power amplifiers and the output port, and is operative to produce the RF output signal as a composite RF output signal.

However, for the linearity power amplifier arrangement in the U.S. Pat. No. 6,104,241, its cost is very high and it is difficult to be applied to a real circuit. Moreover, it only can support 2-way amplifiers.

Furthermore, if the gain of auxiliary amplifier is the same as that of the main amplifier, the matching circuit is complicated and difficult to be implemented. If the gains of both amplifiers are different, the adjacent channel power ratio (ACPR) would be degraded.

BRIEF SUMMARY OF THE INVENTION

According to an embodiment of the present invention, there is provided a linearity power amplification device. The device comprises a divider configured to receive an input signal and to divide the input signal into n first signals, wherein n≥2, and wherein the first signals are the same as the input signal, a combiner, and n−1 first signal paths, wherein at least one first signal path is configured to receive the first signal and to generate a first output signal comprising a first error signal. The first signal path comprises a main invariable attenuator connected to the divider, a first power amplifier connected to the combiner, and a first attenuator and a first shifter coupled between the first power amplifier and the main invariable attenuator so as to attenuate the level and phase of the first signal and amplify an attenuated signal by the first power amplifier to generate the first output signal comprising the first error signal. The linearity power amplification device further comprises a second signal path coupled between the divider and the combiner. The second signal path comprises a main amplification circuit configured to receive and amplify the first signal and a calibration signal, and to generate a second output signal and a second signal associated with the first signal, and an error calibration circuit configured to receive the first output signal and the second signal, and to generate the calibration signal in reversed phase with the first error signal. The combiner is configured to receive the first output signal and the second output signal, and to generate and output a combiner output signal coinciding with the frequency spectrum of the input signal.

BRIEF DESCRIPTION OF THE DRAWINGS

These and other features, aspects and advantage of embodiments of the present invention can be better understood when the following detailed description are read with reference to the accompanying drawings, in which.

DETAILED DESCRIPTION OF THE INVENTION

Embodiments of the present invention are described in detail with reference to the appended figures, in which the same numerical signs refer to the same elements.

Figure 1:
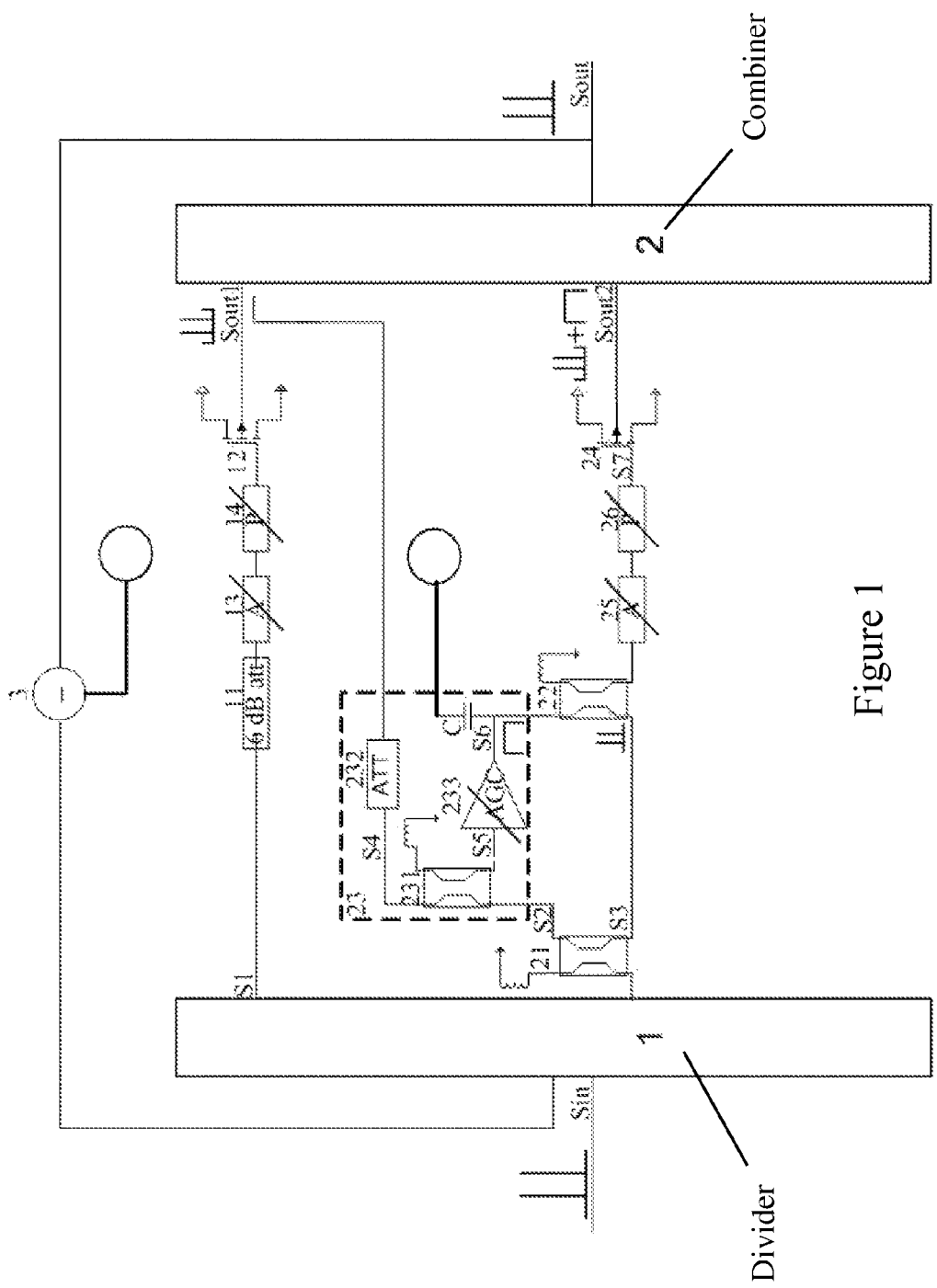
FIG. 1 is a diagram schematically illustrating the structure of a linearity power amplification device according to an embodiment of the present invention.

FIG. 1 is a diagram schematically illustrating the structure of a linearity power amplification device according to an embodiment of the present invention. As shown in FIG. 1, the linearity power amplification device comprises a divider 1, a combiner 2 and a first signal path and a second signal path coupled between the divider 1 and the combiner 2.

The divider 1 is applied with an input signal Sin and generates two first signals S1 that are the same as the input signal. The combiner 2 combines a first output signal Sout1 and a second output signal Sout2 to generate an output signal Sout.

The first signal path comprises a main invariable attenuator 11, a first amplifier 12, an attenuator 13 and a shifter 14. In an embodiment, the main invariable attenuator 11 is a 6 dB attenuator. Optionally, the 6 dB attenuator is composed of two 3 dB electrical bridges in serial.

The attenuator 13 and the shifter 14 are connected between the 6 dB attenuator 11 and the first amplifier 12 to adjust the level and phase of the signal output from the main invariable attenuator 11 and send the adjusted signal to the first power amplifier 12. The attenuator 13 and the shifter 14 are used to trim the signal output power of Sout1 to ensure that the power of the signal S2 can be completely cancelled out (the amplitude being the same but the phase being reversed).

As shown, the attenuator 13 and the shifter 14 are coupled subsequently between the 6 dB attenuator 11 and the first amplifier 12. However, embodiments of the present invention are not limited thereto, and those skilled in the art could adjust the position of the attenuator 13 and the shifter 14, so that, for example, in an embodiment one end of the shifter 14 is connected to the attenuator 11 and the other end of the shifter 14 is connected to the attenuator 13 and the other end of the attenuator 13 is connected to the first amplifier 12.

The first signal S1 is attenuated by the main invariable attenuator 11 to generate a 6 dB-attenuated signal with the same phase as the first signal, which is sent to the first power amplifier 12. After the amplification of the first power amplifier 12, a first output signal Sout1 is generated. During the process of amplifying a signal by the power amplifier, a harmonics (i.e. a first error signal) is generated, so as to cause the first output signal to comprise the first error signal component.

The second signal path comprises an error calibration circuit 23 and a main amplification circuit. The main amplification circuit comprises a first 3 dB electric bridge 21, a second 3 dB electric bridge 22, an attenuator 25, a shifter 26 and a second power amplifier 24. The error calibration circuit 23 comprises a third 3 dB electric bridge 231, a second invariable attenuator 232 and an AGC error amplifier 233. The gain of the second power amplifier 24 is the same as that of the first power amplifier 12.

A first port of the first 3 dB electric bridge 21 is connected to the divider 1 to receive the first signal. Its second port is grounded via a resistor R1 which is, in an embodiment, 50 ohm. Its third port is connected to a first port of the third 3 dB electric bridge 231. Its fourth port is connected to a first port of the second electric bridge 22.

A third port of the third 3 dB electric bridge 231 is grounded via a resistor R2 which is, in an embodiment, 50 ohm. Its second port is connected to the output of the second invariable attenuator 232. Its fourth port is connected to the input of the AGC error amplifier 232.

A second port of the second electric bridge 22 is connected to the output of the AGC error amplifier 233. Its third port is grounded via a resistor R3 which is, in an embodiment, 50 ohm. Its fourth port is connected to the second power amplifier 24 via the attenuator 25 and the shifter 26, so as to adjust the level and phase of the signal output from the second electrical bridge 22 and then to send the adjusted signal to the second power amplifier 24.

As shown, the attenuator 25 and the shifter 26 are coupled subsequently between the second electrical bridge 22 and the second amplifier 24. However, embodiments of the present invention are not limit thereto. Those skilled in the art could adjust their position, so that one end of the shifter 26 is connected to the second electric bridge 22 and the other end is connected to the attenuator 25. The other end of the attenuator 25 is connected to the second amplifier 24.

Below, with reference to the frequency spectrum at several points shown in FIG. 1, the working process of the linearity power amplification device is illustrated.

An input signal Sin is divided into two first signals S1 by the divider 1. One of the first signals S1 is amplified by the first path to generate the first output signal Sout1. As shown, the first output signal Sout1 comprises the first error signal.

The other of the first signals S1 is processed by the first 3 dB electric bridge 21 to generate two signals S2, S3. The phase difference between the signal S2 and the first signal is 90 degrees. The signal S1 and the first signal S1 are in phase.

The first output signal Sout1 is processed by the second invariable attenuator 232 to generate a signal S4. The signals S4 and S2 are processed by the third electrical bridge 231 to generate a second error signal S5=S4−S2. The signal S5 and the first error signal have the same amplitude and phase. The signal S5 is amplified by the AGC error amplifier 233 to generate a calibration signal S6. The signal S6 is phase shifted again by 90 degree and superimposed with the third signal by the attenuator 25 and the shifter 26 to form a signal S7. The signal S7 is amplifier by the second amplifier to generate a second output Sout2.

As illustrated in FIG. 1, the signals S2 and S4 are in reversed phase at the output end of the third 3 dB electric bridge, so as to cancel out S2 at the third electric bridge and maintaining the signal associated with the first error signal, while causing the signal S3 and the first error signal to be in reversed phase. Embodiments of the present invention accomplish this with the attenuator 13 and the shifter 14.

In an embodiment of the present invention, it is just accomplished by using the phase relation between the signals S2 and S3. The signal S2 is phase-delayed 90 degrees in comparison with the signal S1, then phase-shifted 0 degrees by the third 3 dB electric bridge, changed in phase by 180 degrees by the AGC error amplifier, and then phase-shifted 90 degrees by the second 3 dB electric bridge. The signal S2 is totally phase-shifted by 360 degrees (0 degrees). At that time, the output signal from the AGC error amplifier should be in phase with the signal S4, while in reversed phase with the first error signal. Then it can be determined that the first error signal and the signal S3 are in reversed phase.

In the case of incomplete cancellation of S2, the signal S6 must contain the component of the signal S2, which could be output by the capacitor C and detected by a power detection circuit. If beyond a certain threshold, a control circuit would be activated to adjust the adjustable attenuator 13 and the adjustable shifter 14, so as to achieve the object of adjustment of phase and amplitude of Sout1 (i.e. S4) and cause the third electric bridge to only output the signal S5 associated with the error signals.

It is assumed that the power of the signal S1-S6, Sout1 and Sout2 are P1-P6, Pout1 and Pout2 respectively, the power of the first error signal introduced by the first amplifier is A, the gain of the first amplifier 11 and the second amplifier 24 is G, the attenuation of the invariable attenuator 232 is GATT and the gain of the AGC error amplifier 233 is X. Then Sout1=P1−6+G+A, P5=P4−P2=Pout1−GATT−P2=P1−6+G+A−GATT−(P1−3)=G−3+A−GATT. Meanwhile, the signal S5 equals the first error signal, therefore G−3+A−GATT=A, and then GATT=G−3.

Moreover, for the linearity power amplification device of FIG. 1, the power of the total error signal introduced by the first and second amplifiers is A+10log2, and the power of the signal obtained after the second signal path processing the signal S5 is A−(G−3)−3+X−3+G. Since this signal is used to cancel out the total error signal introduced by the first and second amplifiers, A−(G−3)−3+X−3+G=A+10log2. Then X=3+10log2.

Optionally, the attenuators 13, 25 and the shifters 14, 26 of an embodiment of the present invention could be adjustable attenuators and adjustable shifter respectively. Furthermore, the linearity power amplification circuit of an embodiment of the present invention further comprises a capacitor C. Its one end is coupled to the output end of the AGC error amplifier and the other end is coupled to the adjustable attenuator 13, 25 and the adjustable shifter 14, 16 in the first and second signal paths as an attenuation control signal and a phase control signal.

Optionally, the AGC error amplifier 233 could be an adjustable amplifier. Furthermore, the linearity power amplification device in FIG. 1 further comprises a signal eliminator 3. Input ends of the signal eliminator 3 are coupled to the input end of the divider 1 and the output end of the combiner 2 respectively to receive the input signal Sin and the output signal Sout. Its output signal SAGC is used as the control signal for the AGC error amplifier 233, where SAGC=Sout−Sin.

The signal eliminator 3 could be a subtracter or an adder. In the case of the signal eliminator being a subtracter, the two input signals should be adjusted to be in phase. In the case of the signal eliminator being an adder, the two input signals should be adjusted to be in reversed phase. In the embodiment shown in FIG. 1, the signal eliminator 3 is implemented as a subtracter.

Figure 2:
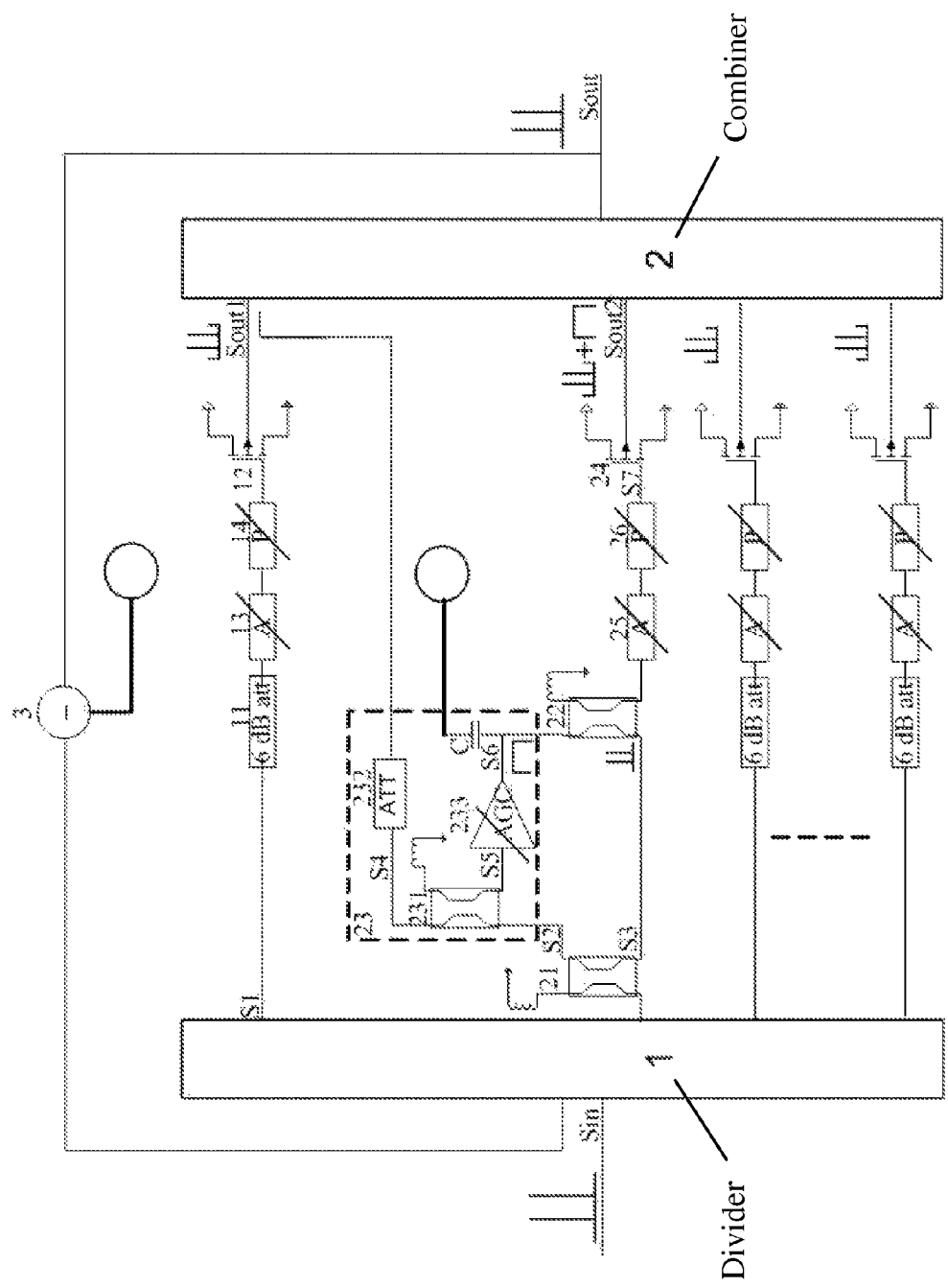
FIG. 2 is a diagram schematically illustrating the structure of a linearity power amplification device according to an embodiment of the present invention.

FIG. 2 is a diagram schematically illustrating the structure of a linearity power amplification device according to an embodiment of the present invention. As shown in FIG. 2, in comparison with the embodiment shown in FIG. 1, it is different in that there are at least two first signal paths in the embodiment shown in FIG. 2.

As shown, the divider 1 is applied with an input signal Sin and generates n first signals S1 that are the same as the input signal. The combiner 2 combines at least two first output signals and a second output signal to generate an output signal Sout.

In comparison with the embodiment shown in FIG. 1, the total error signal power introduced by the power amplifiers in the signal paths is A+10log(n) and the gain X of the AGC error amplifier 233 is 3+10log(n).

Figure 3:
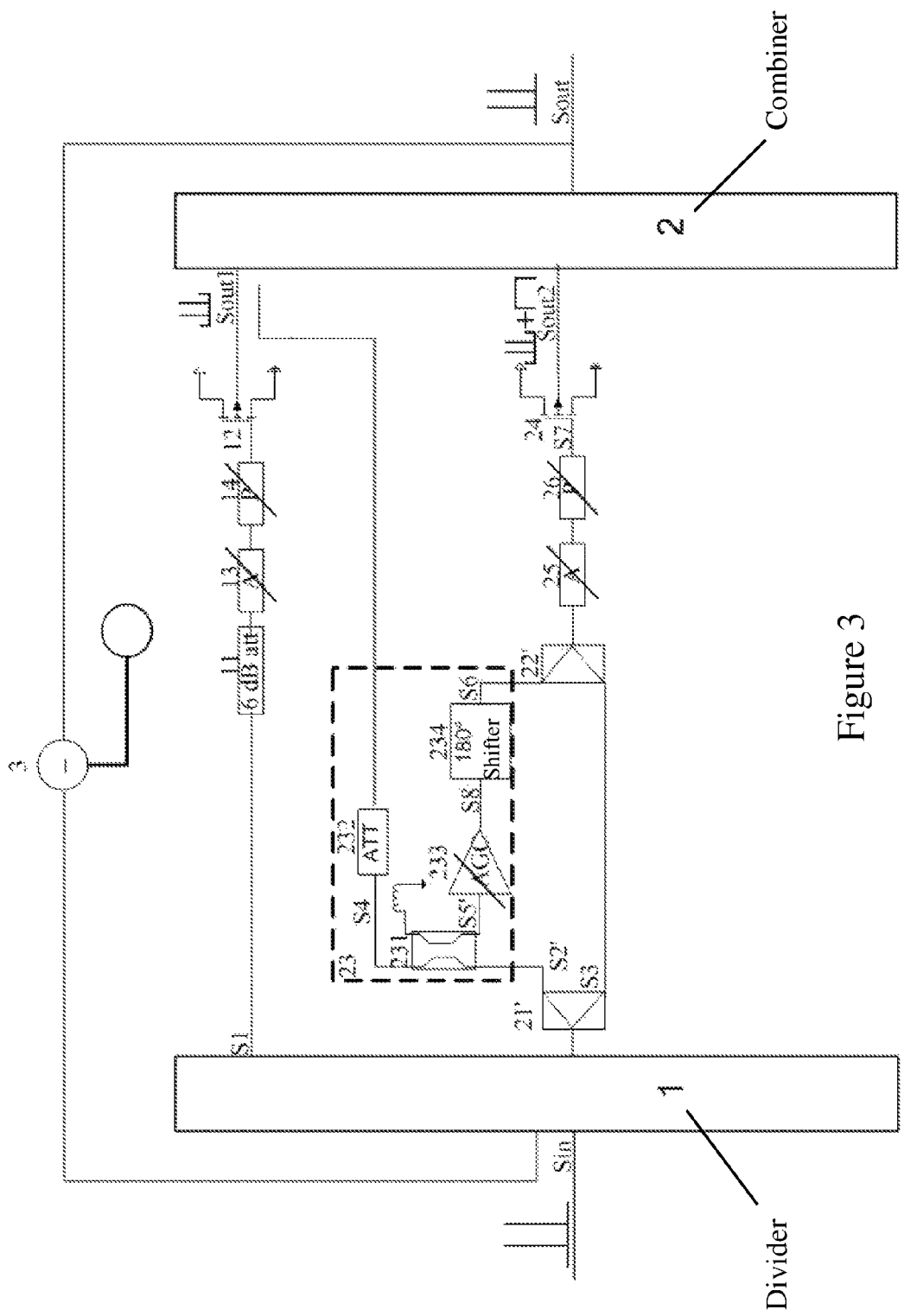
FIG. 3 is a diagram schematically illustrating the structure of a linearity power amplification device according to an embodiment of the present invention.

FIG. 3 is a diagram schematically illustrating the structure of a linearity power amplification device according to an embodiment of the present invention. In comparison with the embodiment shown in FIG. 1, it is different in that the main amplification circuit includes a first power divider 21', a second power divider 22' and a second power amplifier 24. The error calibration circuit includes a 3 dB electric bridge 231, a second invariable attenuator 232, an AGC error amplifier 233 and an inverter 234.

The first power divider 21' receives the signal S1 and outputs signals S2' to the 3 dB electric bridge 231 and S3' to the second power divider 22'. The signals S2' and S3' are in phase, but in difference of 3 dB.

A third port of the 3 dB electric bridge 231 is grounded via a resistor R2 which is, in an embodiment, 50 ohm. Its second port is connected to the output of the second invariable attenuator 232. Its fourth port is connected to the input of the AGC error amplifier 233. The AGC error amplifier 233 is connected to the input of the inverter 234 and the output of the inverter 234 is connected to one of the input ends of the second power divider 22'. The output of the second power divider 22' is connected to the second power amplifier 24.

An input signal Sin is divided into two first signals S1 by the divider 1 with one of the first signals S1 being amplified by the first signal path to generate a first output signal Sout1.

The other of the first signals S1 is processed by the first power divider 21' to generate two signals S2' and S3'. The signals S2, S3 and the first signal S1 are in phase, but their difference is 3 dB.

Although in FIG. 3 the inverter is shown as being positioned after the AGC error amplifier, embodiments of the present invention are not limit thereto. The inverter can be also positioned before the AGC error amplifier.

Furthermore, in an embodiment, the linearity power amplification circuit as shown in FIG. 3 further comprises a capacitor (not shown). One end of the capacitor is coupled to the output end of the inverter or the output end of the AGC error amplifier and the other end of the capacitor is coupled to the adjustable attenuator 13, 25 and the adjustable shifter 14, 16 in the first and second signal paths as an attenuation control signal and a phase control signal.

Figure 4:
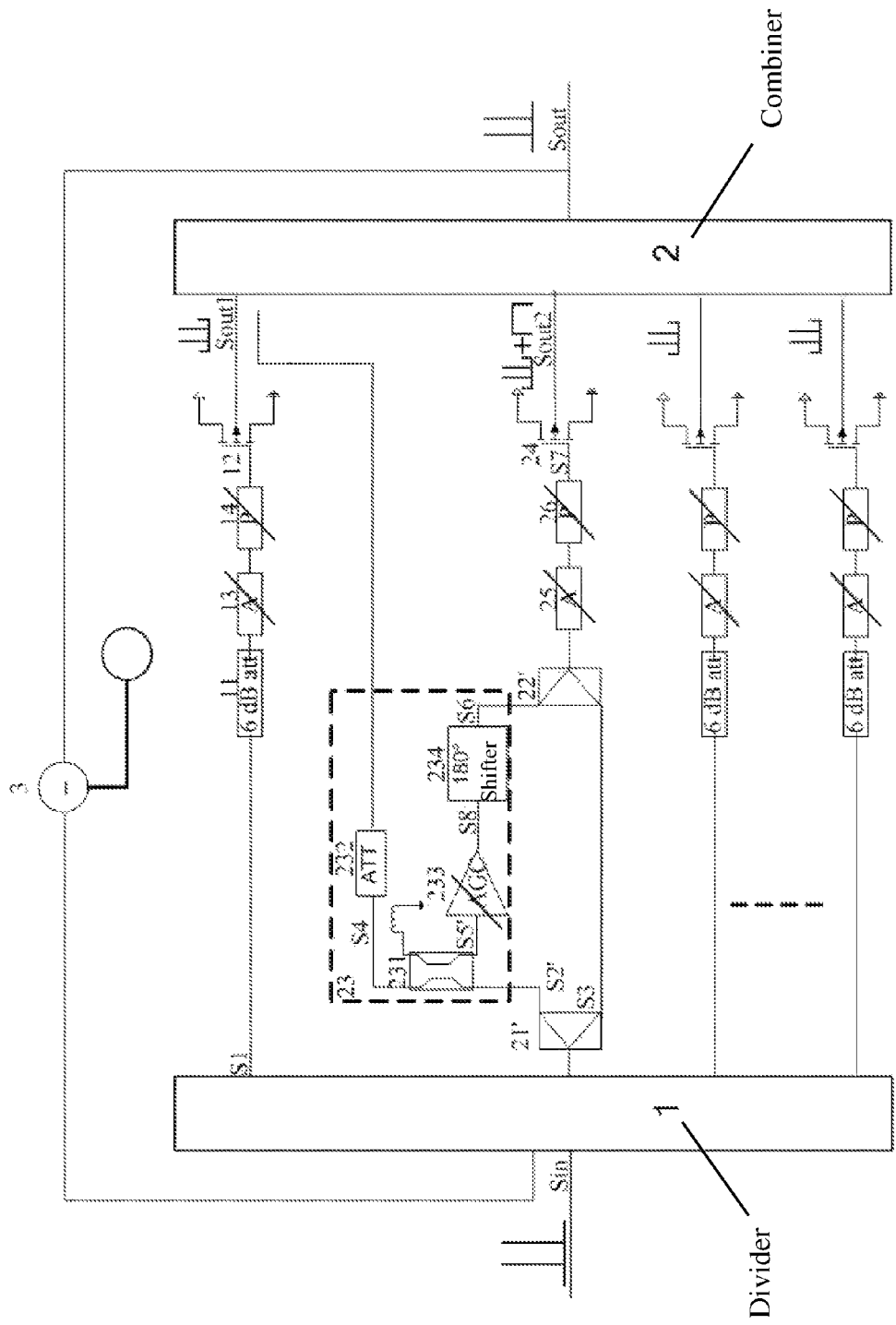
FIG. 4 is a diagram schematically illustrating the structure of a linearity power amplification device according to an embodiment of the present invention.

FIG. 4 is a diagram schematically illustrating the structure of a linearity power amplification device according to an embodiment of the present invention. In comparison with the embodiment shown in FIG. 3, it is different in that there are at least two first signal paths in the embodiment shown in FIG. 4.

In the linearity power amplification device of an embodiment of the present invention, for the first power amplifier 12 and the second power amplifier 24, the AGC error amplifier is used to amplify the error signal using the concept of feedforward. For the second power amplifier 24, since the pre-calibrated signal is flowed into its input end, an embodiment of the present invention uses the concept of pre-calibration.

According to embodiments of the present invention, the linearity power amplification device has at least one first signal path with the gain of the first amplifier in the first signal path being the same as that of the second amplifier in the second signal path and the n−1 (n>=2) dividers output n same first signals and the first signals and the input signal Sin are the same. In an embodiment, signals and elements would be different from each other slightly, but it would not affect the implementation of the linearity power amplification device of other embodiments of the present invention.

In view of the above, an embodiment of the present invention provides a linearity power amplifier device to linearly amplify an input signal. Embodiments of the present invention support the combination of at least 2-way amplifiers, but the prior art supports the combination of 2-way amplifiers only. Due to introduction of the feedback technology, pre-calibration technology and feedforward technology into embodiments of the present invention, in comparison with the prior art, costs are reduced significantly. Due to introduction of the AGC error amplifier, it is helpful to the result of ACPR and in comparison with the common amplifier circuit, 3+10*log(n) dB is increased.

The foregoing description describes some embodiments of the present invention. However, the protection scope of the present invention is not intended to be limited thereto. Any changes or modifications that are conceivable to those skilled in the art based on the above disclosure shall be within the scope of protection of the present invention. Therefore, the protection scope of the present invention should be determined as defined by the claims.

What is claimed is:

1. A linearity power amplification device comprising:
    a divider configured to receive an input signal and to divide the input signal into n first signals, wherein n>2, and wherein the first signals are the same as the input signal;
    a combiner;
    n−1 first signal paths, wherein at least one first signal path is configured to receive the first signal and to generate a first output signal comprising a first error signal, the first signal path comprising:
        a main invariable attenuator connected to the divider;
        a first power amplifier connected to the combiner; and
        a first attenuator and a first shifter coupled between the first power amplifier and the main invariable attenuator so as to attenuate the level and phase of the first signal and amplify an attenuated signal by the first power amplifier to generate the first output signal comprising the first error signal;

a second signal path coupled between the divider and the combiner, the second signal path comprising:
  a main amplification circuit configured to receive and amplify the first signal and a calibration signal, and to generate a second output signal and a second signal associated with the first signal; and
  an error calibration circuit configured to receive the first output signal and the second signal, and to generate the calibration signal in reversed phase with the first error signal,
wherein the combiner receives the first output signal and the second output signal, and generates and outputs a combiner output signal coinciding with the frequency spectrum of the input signal.

2. The linearity power amplification device according to claim 1, wherein the main invariable attenuator is a 6 dB attenuator.

3. The linearity power amplification device according to claim 2, wherein the main amplification circuit comprises:
  a first 3 dB electric bridge and a second 3 dB electric bridge,
  wherein the first 3 dB electric bridge is configured to receive one of the first signals and to output the second signal to the error calibration circuit and a third signal to the second 3 dB electric bridge, wherein the second signal and the first signal is different from each other by 90 degree in phases and by 3 dB, and wherein the third signal and the first signal are in phase but different from each other by 3 dB,
  wherein the second 3 dB electric bridge is configured to receive the third signal and the calibration signal and to output a summing signal to a second shifter or a second attenuator, wherein the second shifter or the second attenuator is connected between the second 3 dB electric bridge and a second power amplifier, the second power amplifier being configured to receive and amplify an output signal from the second shifter or the second attenuator, and to generate and output the second output signal comprising a second error signal, and
  wherein the error calibration circuit comprises:
    a third invariable attenuator configured to receive and attenuate the first output signal from any one of the first signal paths;
    a third 3 dB electric bridge configured to receive an attenuated first output signal and the second signal, and to generate and output a third error signal in reversed phase with the second signal; and
    an AGC error amplifier configured to receive and amplify the third error signal, and to venerate the calibration signal in reversed phase with the second error signal.

4. The linearity power amplification device according to claim 3, wherein the gain of the first power amplifier is the same as the gain of the second power amplifier.

5. The linearity power amplification device according to claim 3, wherein the gain of the AGC error amplifier is 3+10*log(n), and wherein the attenuation value of the third invariable attenuator is G−3, wherein G is the gain of the first power amplifier.

6. The linearity power amplification device according to claim 3, further comprising a capacitor with one end of the capacitor coupled to an output end of the AGC error amplifier and another end of the capacitor coupled to the first and second attenuators and the first and second shifters, wherein the capacitor is used as an attenuation control signal and a phase control signal,
wherein the first shifter and the second shifter are adjustable shifters, and wherein the first attenuator and the second attenuator are adjustable attenuators.

7. The linearity power amplification device according to claim 2, wherein the main amplification circuit comprises:
  a first power divider configured to receive one of the first signals and to output the second signal to the error calibration circuit and a third signal to a second power divider, wherein the second signal and the third signal are in phase with the first signal but differ from the first signal by 3 dB,
  wherein the second power divider is configured to receive the third signal and the calibration signal, and to output a summing signal to a second shifter or a second attenuator, wherein the second shifter or the second attenuator is connected between a second 3 dB electric bridge and a second power amplifier,
  wherein the second power amplifier is configured to receive and amplify the output signal from the second shifter or the second attenuator, and to generate and output the second output signal comprising a second error signal to the combiner, and
  wherein the error calibration circuit comprises:
    a third invariable attenuator configured to receive and attenuate the first output signal from any one of the first signal paths;
    a third 3 dB electric bridge configured to receive an attenuated first output signal and the second signal, and to generate and output a third error signal in reversed phase with the second signal; and
    an AGC error amplifier and an inverter connected between the third 3 dB electric bridge and the second power divider, the AGC error amplifier configured to receive and amplify the third error signal, and to generate the calibration signal in reversed phase with the second error signal.

8. The linearity power amplification device according to claim 7, wherein the gain of the first power amplifier is the same as the gain of the second power amplifier.

9. The linearity power amplification device according to claim 7, wherein the gain of the AGC error amplifier is 3+10*log(n), the attenuation value of the third invariable attenuator is G−3, where G is the gain of the first power amplifier.

10. The linearity power amplification device according to claim 7, further comprising a capacitor with one end of the capacitor coupled to the inverter and another end of capacitor coupled to the first and second attenuators and the first and second shifters, wherein the capacitor is used as an attenuation control signal and a phase control signal,
wherein the first shifter and the second shifter are adjustable shifters, and wherein the first attenuator and the second attenuator are adjustable attenuators.

11. The linearity power amplification device according to claim 1, further comprising:
  an adjustable AGC error amplifier; and
  a signal eliminator configured to receive the combiner output signal and the input signal and to generate a difference signal as a gain control signal for the adjustable AGC error amplifier, wherein the difference signal is the difference between the combiner output signal and the input signal.

* * * * *

UNITED STATES PATENT AND TRADEMARK OFFICE
CERTIFICATE OF CORRECTION

| | | |
|---|---|---|
| PATENT NO. | : 8,866,545 B2 | Page 1 of 1 |
| APPLICATION NO. | : 13/628637 | |
| DATED | : October 21, 2014 | |
| INVENTOR(S) | : Xing et al. | |

It is certified that error appears in the above-identified patent and that said Letters Patent is hereby corrected as shown below:

Title page, item (73), under "Assignee", in Column 1, Line 2, delete "Company," and insert -- Company, LLC, --, therefor.

Specification

In Column 3, Line 46, delete "amplifier 232." and insert -- amplifier 233. --, therefor.

Claims

In Column 6, Line 57, in Claim 1, delete "n>2," and insert -- n≥2, --, therefor.

In Column 7, Line 53, in Claim 3, delete "venerate" and insert -- generate --, therefor.

Signed and Sealed this
Twentieth Day of October, 2015

Michelle K. Lee
*Director of the United States Patent and Trademark Office*